Aug. 25, 1970 D. IORDANIDIS 3,525,883

BRIDGE AMPLIFIER CIRCUIT

Filed July 28, 1967 2 Sheets-Sheet 1

INVENTOR
DEMETRE IORDANIDIS
BY
Maybee & Legris
ATTORNEYS

BRIDGE AMPLIFIER CIRCUIT

Filed July 28, 1967 2 Sheets-Sheet 2

INVENTOR
DEMETRE IORDANIDIS
BY Maybee & Legris
ATTORNEYS

United States Patent Office 3,525,883
Patented Aug. 25, 1970

3,525,883

BRIDGE AMPLIFIER CIRCUIT

Demetre Iordanidis, Toronto, Ontario, Canada, assignor, by mesne assignments, to Dover Corporation, New York, N.Y., a corporation of Delaware Filed July 28, 1967, Ser. No. 656,758
Int. Cl. H02p *5/36;* H03k *17/66*
U.S. Cl. 307—254 7 Claims

ABSTRACT OF THE DISCLOSURE

A bridge amplifier circuit for controlling the current through a load comprises four power transistors connected in the arms of a four-arm bridge, the bridge having a pair of supply terminals for connection to a D.C. supply source, and a pair of load terminals for connection to a load circuit. The transistors in the bridge arms are controlled alternately in pairs so that at any one time two diagonally opposite arms of bridge are conducting and the other two diagonally opposite arms are non-conducting, the load current flowing between the load terminals in a direction determined by which one of the pairs of bridge transistors is conducting. The bridge transistors are controlled by control transistors, whose collectors are connected respectively to the bases of one pair of bridge transistors and whose emitters are connected respectively to the bases of the other pair of bridge transistors. Preferably an amplifier stage is provided between each of the transistors of the first pair and its respective control transistor. By applying trains of control pulses to the bases of the control transistors, the trains of pulses being of variable pulse width and inverted with respect to one another, an infinite control of the load current can be obtained.

BACKGROUND OF THE INVENTION

This invention relates to bridge amplifiers and bridge amplifier circuits. The invention is especially applicable to means for effecting a very fine control of load current, particularly in a circuit including an inductive load such as the field winding of a dynamo-electric machine, for example.

It is known to control fairly large direct currents at relatively high voltage by means of control circuits including thyratrons, silicon-controlled rectifiers, magnetic amplifiers or the like, such devices being connected to an alternating current source and the load current being controlled by adjusting the time in each cycle at which the device fires. Devices of that kind lack flexibility and accuracy of control is dependent largely upon the constancy of the supply frequency.

It is an object of the present invention to provide means for effecting a very fine adjustment or control of current, which is suitable for a wide variety of applications.

SUMMARY OF THE INVENTION

The invention makes use of power transistors connected in a bridge circuit, the transistors being capable of handling large currents. The bridge circuit comprises a pair of supply terminals for connection to a D.C. supply source, a pair of load terminals, a first pair of transistors whose collectors are connected to one supply terminal and whose emitters are connected each to a respective load terminal, a second pair of transistors whose collectors are connected each to a respective load terminal and whose emitters are connected to the other supply terminal, and a pair of control transistors whose collectors are connected respectively to the bases of the transistors of the first pair and whose emitters are connected respectively to the bases of the transistors of the second pair, the control transistors being connected to the supply source through respective emitter and collector impedances providing phase splitting circuits, and means being provided for applying opposite polarity control signals to the bases of the control transistors. The transistors of said first and second pairs are of the same conductivity type, and in the preferred embodiment described herein are of NPN type.

Preferably the collectors of the control transistors are connected to the bases of the first pair of transistors by respective circuits each including a further transistor whose collector is connected to one supply terminal through a collector impedance, whose emitter is connected to the base of the respective transistor of the first pair, and whose base is connected to the collector of the respective control transistor.

BRIEF DESCRIPTION OF THE DRAWINGS

An embodiment of the invention will now be described by way of example with reference to the accompanying drawings, in which.

DESCRIPTION OF THE PREFERRED EMBODIMENT

Figure 1:
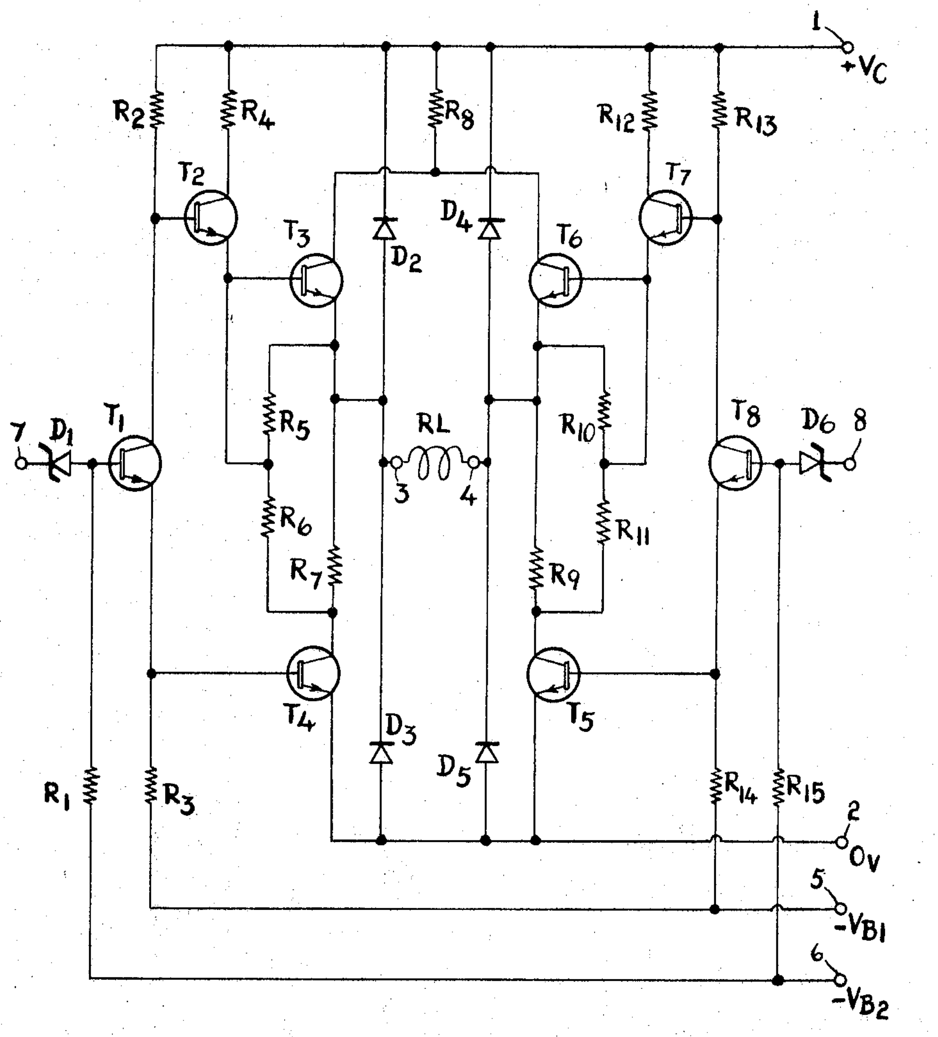
FIG. 1 is a circuit diagram of a bridge amplifier according to the invention.

Referring to FIG. 1, the bridge amplifier includes eight power transistors T1, T2, T3, T4, T5, T6, T7 and T8, all of which are of the NPN type operating as switches. A positive voltage applied to the base of such a transistor switches it ON, reducing the collector-emitter saturation resistance to a low value and permitting the flow of direct current. When a negative or zero voltage is applied to the base, the transistor is switched off. At the present time the power transistors that are available are generally of the NPN type, but in principle PNP transistors could be used if the voltage polarities are appropriately reversed.

Transistors T3, T4, T5 and T6 form the arms of the bridge itself, T1 and T8 are control transistors, and T2 and T7 are amplifier stages between the control transistors and the transistors T3 and T6. The bridge comprises a pair of supply terminals 1 and 2 for connection to a D.C. supply source, and a pair of load terminals 3 and 4, between which is connected a load circuit RL. One pair of bridge arms is formed by transistors T3 and T6, whose collectors are connected to the positive supply terminal 1 through a resistor R8 forming a common collector impedance, and whose emitters are connected respectively to the load terminals 3 and 4. The other pair of bridge arms is formed by the transistors T4 and T5, whose emitters are connected to the supply terminal 2 and whose collectors are connected respectively to the load terminals 3 and 4 through resistors R7 and R9. It will be seen that when transistors T3 and T5 are conducting, transistors T4 and T6 being cut off, then load current will flow in the direction from terminal 3 to terminal 4; conversely, when transistors T3 and T5 are cut off and transistors T4 and T6 are conducting, load current will flow in the direction from terminal 4 to terminal 3.

The transistor T3 has a base-emitter bias circuit formed by a resistance network R5, R6 and R7, and has an input circuit formed by a further transistor T2, whose collector is connected to the terminal 1 via a collector resistor R4 and whose emitter is connected to the base of transistor T3. Similarly, the transistor T6 has a base-emitter bias circuit formed by a resistance network R9, R10 and R11, and has an input circuit formed by transistor T7, whose collector is connected to the terminal 1 via a collector resistor R12 and whose emitter is connected to the base of transistor T6. Control transistor T1 has a collector resistor R2 and its emitter is connected to the base of transistor T4, which has a base biassing resistor R3 connected to negative supply terminal 5. Control transistor T8 has a collector resistor R13 and its emitter is connected to the base of transistor T5, which has a base biassing resistor R14 connected to negative supply terminal 5. Zener diode D1 with resistor R1 and Zener diode D6 with resistor R15 form the base-emitter biassing network of the transistors T1 and T8 respectively.

If a positive voltage appears at input terminal 7 while the input terminal 8 is at zero voltage, transistor T1 will switch ON, and this transistor operating as an emitter-follower drives transistor T4 ON. In the ON state the collector-emitter saturation voltage of transistor T1 is low enough to hold transistor T2 OFF, and the transistor T2 operating as an emitter-follower drives transistor T3 OFF. With zero voltage applied to its base, the transistor T8 is held OFF, and operating as an emitter-follower drives transistor T5 OFF. Since transistor T8 is not conducting, positive voltage is applied to the base of transistor T7, through resistor R13, and switches it ON. Transistor T7 operating as an emitter-follower drives transistor T6 ON. The result is that both transistors T4 and T6 are switched ON while transistors T3 and T5 are switched OFF. Current flows through transistor T4, resistor R7, load RL in the direction from terminal 4 towards terminal 3, and through transistor T6 and resistor 8 to the positive supply terminal 1. The current creates a small positive voltage drop on resistor R7 and a portion of this voltage drop is applied through the dividing network formed by resistors R5 and R6 to the base of transistor T3 and emitter of transistor T2. The voltage that appears at the common point of resistors R5 and R6 is sufficient to keep transistors T3 and T2 reversed-biased and safely switched OFF.

If now a positive voltage appears at input terminal 8 and a zero voltage at input terminal 7, these conditions are reversed. Thus, transistor T8 will switch ON driving transistor T5 ON. Transistor T7 will switch OFF, so driving transistor T6 OFF. With zero voltage applied to the base of transistor T1, the latter will switch OFF driving transistor T4 OFF. Transistor T2 will be switched ON by the positive voltage applied to its base through resistor R2, and this will drive transistor T3 ON. Finally transistors T3 and T5 will be switched ON, while transistors T4 and T6 are switched OFF, and the current will flow through transistor T5, resistor R9, load RL in the direction from terminal 3 to its terminal 4, and through transistor T3 and resistor R8.

It will be seen that if a train of positive voltage pulses is applied to each of the input terminals, the pulses being such that one input terminal is at zero voltage when the other input terminal is at a positive voltage, and vice versa, a pulsating current in both directions will flow through the load circuit RL, the average value of the current being zero if the two trains have equal pulse widths. If the load is inductive, then the instantaneous value of the load current will be decreasing toward zero for an increasing pulse repetition rate. If the pulses applied to one input terminal are increased in width while the pulse width of the pulses applied to the other input terminal is correspondingly decreased, the resultant load current will have a direct current component whose magnitude will increase with the disparity between the pulse widths.

If the terminal 8 is maintained continuously at zero voltage and a train of positive pulses is applied to terminal 7, a pulsating direct current will flow in the direction from terminal 3 towards terminal 4 and the magnitude of this current will be function of the pulse width. Conversely, if the input terminal 7 is maintained continuously at zero voltage and a train of pulses is applied to input terminal 8, the load current will flow in the direction from terminal 4 towards terminal 3 and may be controlled by adjustment of the pulse width. Thus by suitably selecting the pulsating control voltages, load current can be made to increase or decrease in either direction or in both directions, or can be maintained continuously at a desired value.

Suitable values for the components of the bridge amplifier circuit shown in FIG. 1, when used to supply a load requiring 2.5 amps at 100 volts, are listed in the following table:

TABLE

| | |
|---|---|
| Voltage at terminals: | |
| 1 | +120 v. |
| 5 | −1.5 v. |
| 6 | −3 v. |
| Resistors: | |
| R1 | 330 ohms, ½ w. |
| R2 | 475 ohms, 30 w. |
| R3 | 150 ohms, ½ w. |
| R4 | 58 ohms, 5 w. |
| R5 | 150 ohms, ½ w. |
| R6 | 220 ohms, ½ w. |
| R7 | 1.5 ohms, 10 w. |
| R8 | 6.15 ohms, 40 w. |
| R9 | 1.5 ohms, 10 w. |
| R10 | 150 ohms, ½ w. |
| R11 | 220 ohms, ½ w. |
| R12 | 58 ohms, 5 w. |
| R13 | 415 ohms, 30 w. |
| R14 | 150 ohms, ½ w. |
| R15 | 330 ohms, ½ w. |
| Transistors T1–T8 | 2N4347 type. |
| Diodes D1 and D6 | Zener diodes with 3 volt Zener voltage at 20 ma. |
| D2–D5 | Diodes with 4 amperes forward current and 200 volts peak inverse voltage. |

Figure 2A:
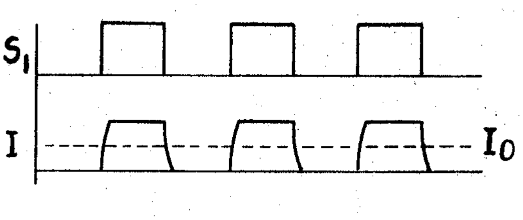
FIGS. 2*a*, 2*b*, 2*c* and 2*d* are diagrams illustrating the control characteristics of the bridge amplifier.

Referring now to FIG. 2*a*, which shows the relationship between load current I and an input signal $S_1$ applied to one input terminal, the other input terminal being maintained at zero voltage, it will be seen that a pulse of load current appears for each pulse of the input signal. The pulses of load current are not strictly rectangular if the load is reactive, and it will be appreciated that in the case of an inductive load the average current $I_0$ will be a function of the pulse repetition frequency.

Figure 2B:
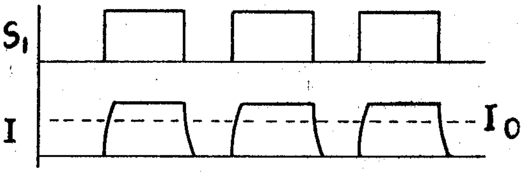

FIG. 2*b* shows the conditions in which the pulses of the input signal $S_1$ are of greater width; the load current pulses are of also greater width and the average load current $I_0$ is increased.

Figure 2C:
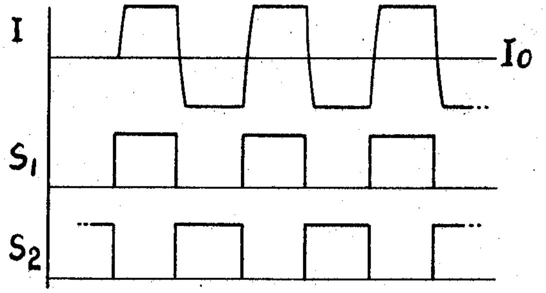

FIG. 2*c* shows the form of load current when square wave pulses of equal pulse width are applied to each of the terminals 7 and 8. The load current will be pulsating in both directions, and its average value will be zero.

Figure 2D:
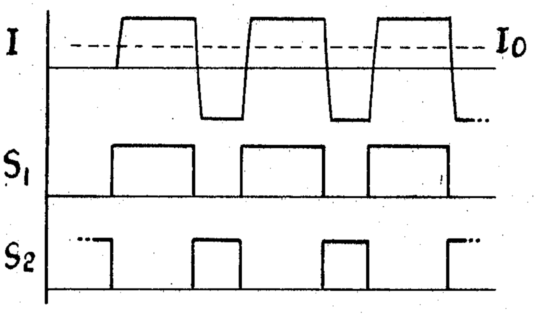

FIG. 2*d* shows the pulses of signal $S_1$ of greater width than the pulses of signal $S_2$, and in this case, the load current pulses are not symmetrical and so a net average value $I_0$ will be obtained.

Figure 3:
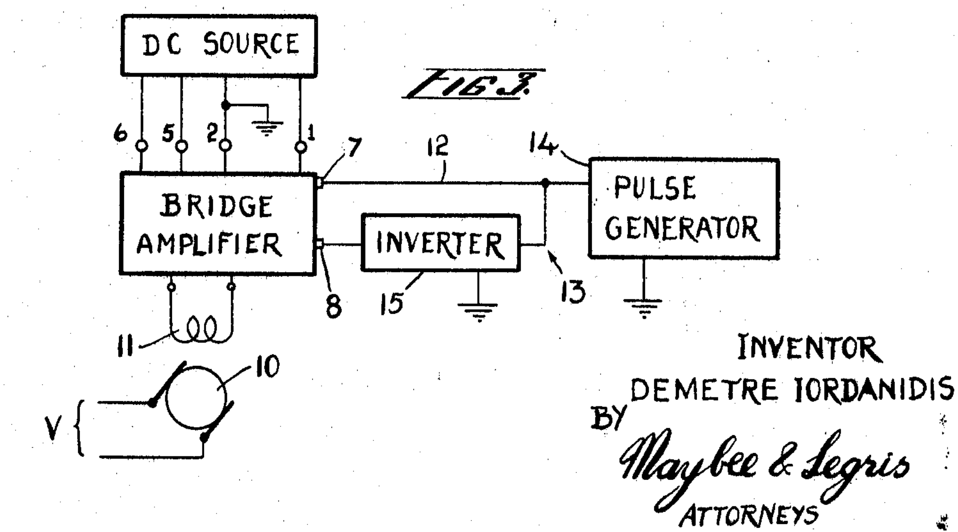
FIG. 3 is a schematic block diagram showing one application of the bridge amplifier.

FIG. 3 shows the application of the circuit shown in FIG. 1 to a field control system for an electric motor 10. A field winding 11 of the motor is connected across load terminals 3 and 4 of the bridge amplifier, the bridge amplifier also having terminals 1, 2, 5 and 6 connected to the appropriate tappings of the D.C. voltage supply. The input terminals 7 and 8 are connected via circuits 12 and 13 to a pulse supply means 14 for supplying a train of pulses of variable width. The circuit 13 includes an inverter 15. It will be seen that by adjusting the width of the pulses from the pulse supply means 14, the average value of the load current through field winding 11 may be varied in either direction.

When the load circuit is inductive it is desirable to limit the voltages across the bridge transistors T3, T4, T5 and T6 to the value of the supply voltage during the switching OFF operations. For this purpose each of the load terminals 3, 4 (FIG. 1) is connected to each of the supply terminals 1, 2 via a diode D2, D3, D4, D5, the diodes being connected so as to be non-conductive under steady state conditions but conductive to transients that develop in the inductive load during switching OFF.

What I claim as my invention is:

1. A bridge amplifier capable of handling high load currents at high voltages, comprising a pair of supply terminals for connection to a D.C. supply source, a pair of load terminals for connection to a load circuit, a first pair of transistors of similar conductivity type each having a collector, an emitter and a base, the collectors being connected to one said supply terminal and the emitters being connected each to a respective one of the load terminals, a second pair of transistors of the same conductivity type as said first pair of transistors each having a collector, an emitter and a base, the emitters being connected to the other supply terminal and the collectors being connected each to a respective one of the load terminals, a pair phase splitting circuits each including a control transistor having a collector, an emitter and a base, the collectors being connected respectively to the bases of the transistors of the first pair, and the emitters being connected respectively to the bases of the transistors of the second pair, means for connecting the phase splitting circuits across the D.C. supply source, and input circuits to the bases of the control transistors for applying opposite polarity control pulses thereto.

2. A bridge amplifier according to claim 1, in which the collectors of the control transistors are connected to the bases of the transistors of the first pair by respective circuits each including a further transistor having a collector, an emitter and a base, the collector being connected to said one supply terminal, the emitter being connected to the base of the respective transistor of the first pair, and the base being connected to the collector of the respective control transistor.

3. A bridge amplifier according to claim 1, in which the input circuits to the bases of the control transistors include Zener diodes.

4. A bridge amplifier circuit capable of handling high load currents at high voltages, comprising a pair of supply terminals and a pair of load terminals, a D.C. supply source connected across the supply terminals, a load circuit connected between the load terminals, a first pair of transistors of similar conductivity type each having a collector, an emitter and a base, the collectors being connected to one said supply terminal and the emitters being connected each to a respective one of the load terminals, a second pair of transistors of the same conductivity type as said first pair of transistors each having a collector, an emitter and a base, the emitters being connected to the other supply terminal and the collectors being connected each to a respective one of the load terminals, and a pair of phase splitting circuits each comprising a control transistor having a collector, an emitter and a base, the collectors being connected respectively to the bases of the transistors of the first pair, and the emitters being connected respectively to the bases of the transistors of the second pair, circuit means for connecting the phase splitting circuits across the D.C. supply source, and means for applying opposite polarity control pulses to the bases of the control transistors.

5. A bridge amplifier according to claim 4, in which the collectors of the control transistors are connected to the bases of the transistors of the first pair by respective circuits each including a further transistor having a collector, an emitter and a base, the collector being connected to said one supply terminal, the emitter being connected to the base of the respective transistor of the first pair, and the base being connected to the collector of the respective control transistor.

6. A bridge amplifier circuit according to claim 5, wherein the load circuit comprises an inductive load, and wherein each load terminal is connected to each of the supply terminals via a diode, the diodes being non-conductive under steady state conditions but conductive to transients developed in the inductive load whereby to limit the voltages across the bridge transistors during switching OFF, to the supply voltage.

7. In combination with a bridge amplifier circuit according to claim 6, means for supplying a train of pulses of variable width, circuit means connecting the pulse supply means to one said input circuit, circuit means for connecting the pulse supply means to the other input circuit, and an inverter connected between the pulse supply means and said other input circuit.

References Cited

UNITED STATES PATENTS

| | | | |
|---|---|---|---|
| 2,838,675 | 6/1958 | Wanlass | 307—255 |
| 3,031,588 | 4/1962 | Hilsenrath | 307—254 |
| 3,078,379 | 2/1963 | Plogstedt et al. | 307—254 |
| 3,174,058 | 3/1965 | Xylander | 307—254 |
| 3,182,210 | 5/1965 | Jebens | 307—254 |
| 3,191,121 | 6/1965 | Nelson | 307—254 |
| 3,009,070 | 11/1961 | Barnes | 307—254 |
| 3,437,842 | 4/1969 | Brouwer | 307—254 |

JOHN S. HEYMAN, Primary Examiner

H. A. DIXON, Assistant Examiner

U.S. Cl. X.R.

318—20, 293